United States Patent [19]
Allin et al.

[11] Patent Number: 5,420,511
[45] Date of Patent: May 30, 1995

[54] SYSTEM FOR CONTINUOUS MONITORING OF THE ELECTRICAL CONDUCTION OF AN AC POWER SYSTEM

[75] Inventors: Patrice Allin; Gérard Gaildrat, both of Meylan, France

[73] Assignee: Merlin Gerin, France

[21] Appl. No.: 204,967

[22] Filed: Mar. 2, 1994

[30] Foreign Application Priority Data

Mar. 18, 1993 [FR] France ................. 93 03248

[51] Int. Cl.$^6$ .......................................... G01R 31/08
[52] U.S. Cl. ................................... 324/522; 324/525; 340/661
[58] Field of Search ............. 324/522, 525, 539, 541, 324/543, 544, 130; 340/658, 660, 661; 361/49, 86, 87

[56] References Cited

U.S. PATENT DOCUMENTS

| | | |
|---|---|---|
| 4,400,663 | 8/1983 | May ................................. 324/525 |
| 5,150,057 | 9/1992 | Suptitz et al. ..................... 324/508 |

FOREIGN PATENT DOCUMENTS

| | | |
|---|---|---|
| 0199979 | 12/1986 | European Pat. Off. . |
| 0430823 | 6/1991 | European Pat. Off. . |
| 2386043 | 10/1978 | France . |
| 2449016 | 6/1975 | Germany . |

Primary Examiner—Kenneth A. Wieder
Assistant Examiner—Diep Do
Attorney, Agent, or Firm—Parkhurst, Wendel & Rossi

[57] ABSTRACT

A system for continuously monitoring electrical conduction of an AC power system comprises at least one measuring module connected between two conductors of the power system. A measuring cycle is divided into two periods. During the first period, the module measures a first DC voltage component, representative of the stray DC components, applied to its terminals. During the second period, the measuring module inputs a DC current component to the power system and measures a second DC component of the voltage applied to its terminals. The difference between the second and first components is used to detect a conduction fault, the line resistance upline from the measuring module being proportional to this difference. The first and second components are obtained by computing the mean value, weighted if necessary, of DC voltage samples measured during measuring periods of a duration lower than or equal to the first and second periods.

10 Claims, 3 Drawing Sheets

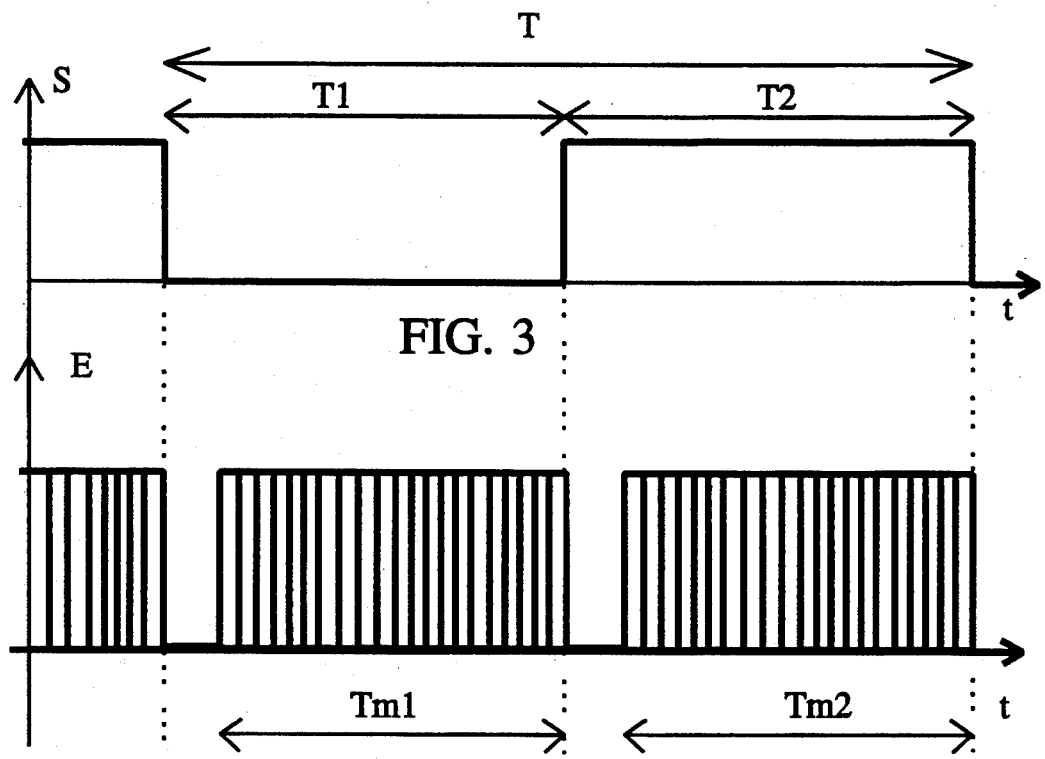
FIG. 3
FIG. 4
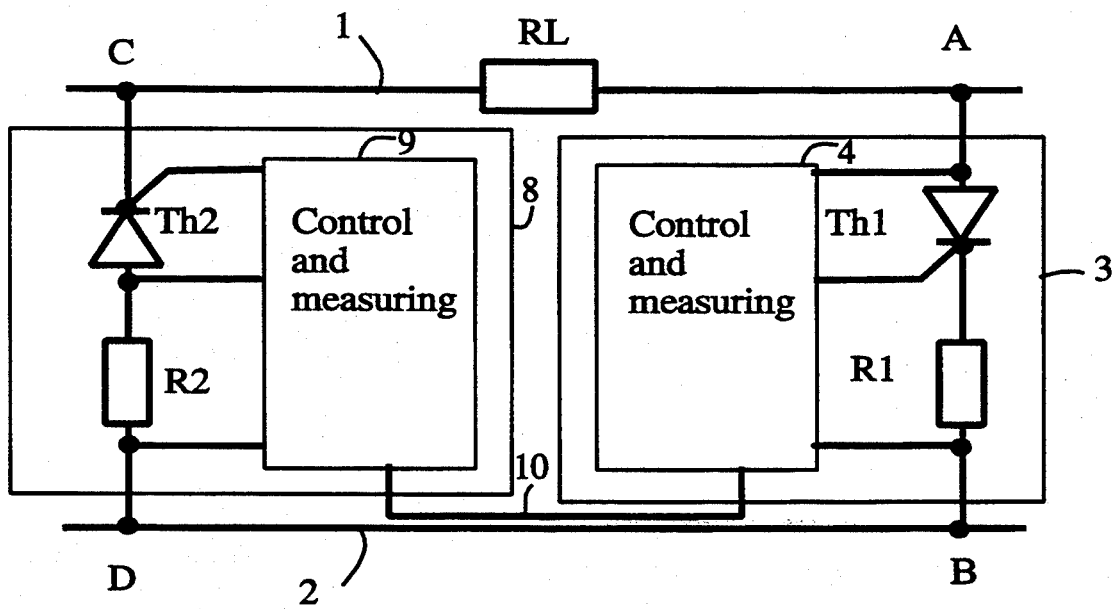
FIG. 6

SYSTEM FOR CONTINUOUS MONITORING OF THE ELECTRICAL CONDUCTION OF AN AC POWER SYSTEM

BACKGROUND OF THE INVENTION

The invention relates to a system for continuous monitoring of the electrical conduction of at least a portion of an AC power system, comprising at least one module comprising means for producing a DC current component between first and second points located respectively on first and second conductors of the power system, means for measuring the DC voltage component applied between these first and second points and means for detecting a conduction fault taking account of said DC voltage component, the means for producing a DC current component comprising a controlled rectifier and means for controlling the controlled rectifier.

State-of-the-art systems, notably the one described in the document EP-A-430,823, corresponding to US Pat. No. 5,150,057, do not take the possible presence of stray DC currents on the power system into account.

SUMMARY OF THE INVENTION

The object of the invention is to achieve a system enabling the influence of stray DC currents to be eliminated.

According to the invention, this objective is achieved by the fact that the means for controlling the controlled rectifier supply a turn-off signal of the controlled rectifier during a first period, of preset duration, of a measuring cycle and control signals designed to produce said DC current component during a second period, of preset duration, of the measuring cycle, the means for measuring the DC voltage component comprising means for measuring first and second values respectively representative of said DC voltage component during said first and second periods, and means for computing the difference between the first and second value, said difference being representative of the DC component to be measured.

According to a development of the invention, the system comprises at least one measuring module and one loop module each comprising a reverse-mounted controlled rectifier and means for controlling said controlled rectifier, the controlling means of the measuring and loop modules being synchronized so as to turn-off the controlled rectifiers of said modules during the first period.

By computing the difference between the DC voltage components at the terminals of the measuring and loop modules, the measuring means of the measuring and loop modules comprising means for simultaneous sampling of the voltages to be measured, it is possible to also eliminate residual low frequency strays.

BRIEF DESCRIPTION OF THE DRAWINGS

Other advantages and features will become more clearly apparent from the following description of illustrative embodiments of the invention, given as non-restrictive examples only and represented in the accompanying drawings in which:

FIGS. 3 and 4 respectively illustrate the input and measuring periods in a particular embodiment of the invention.

FIG. 6 represents another embodiment of the invention, comprising measuring and loop modules.

DETAILED DESCRIPTION OF THE PREFERRED EMBODIMENT

Figure 1:
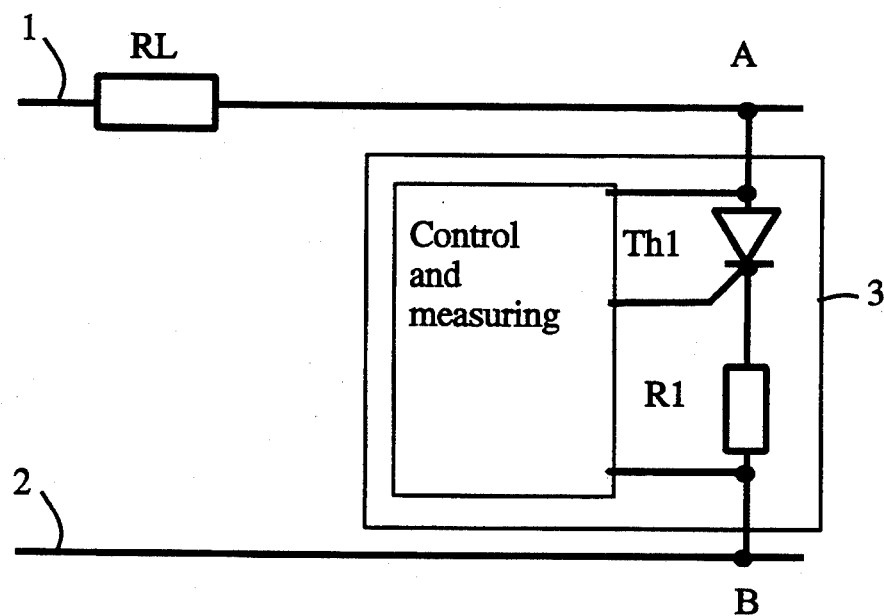
FIG. 1 illustrates schematically a conduction monitoring system according to the prior art.

The state-of-the-art system represented in FIG. 1 is designed for monitoring the conduction of a portion of single-phase AC electrical power system, comprising two conductors 1 and 2. A measuring module 3 comprises two terminals connected to points A and B, situated respectively on each of the conductors 1 and 2. A resistor RL schematizes the line resistance of the power system up-line from the points A and B. The measuring module 3 comprises means for producing a DC current component. In FIG. 1, these means are formed by a thyristor Th1 connected in series with a resistor R1 between the terminals of the measuring module 3. A control and measuring circuit 4 supplies control signals to the trigger of the thyristor Th1, so as to impose the flow, in the measuring module, of a DC current component Ic of preset value. The control and measuring circuit 4 is connected to the terminals of the measuring module so as to receive on input the voltage applied between the points A and B. When the DC current component is constant, a variation of the DC voltage component between the points A and B is representative of a variation of the line resistance RL up-line from the points A and B. The circuit 4 detects an increase of said DC voltage component, representative of an increase of the line resistance RL, compares this increase with a preset threshold and indicates a conduction fault when the threshold is exceeded.

Figure 2:
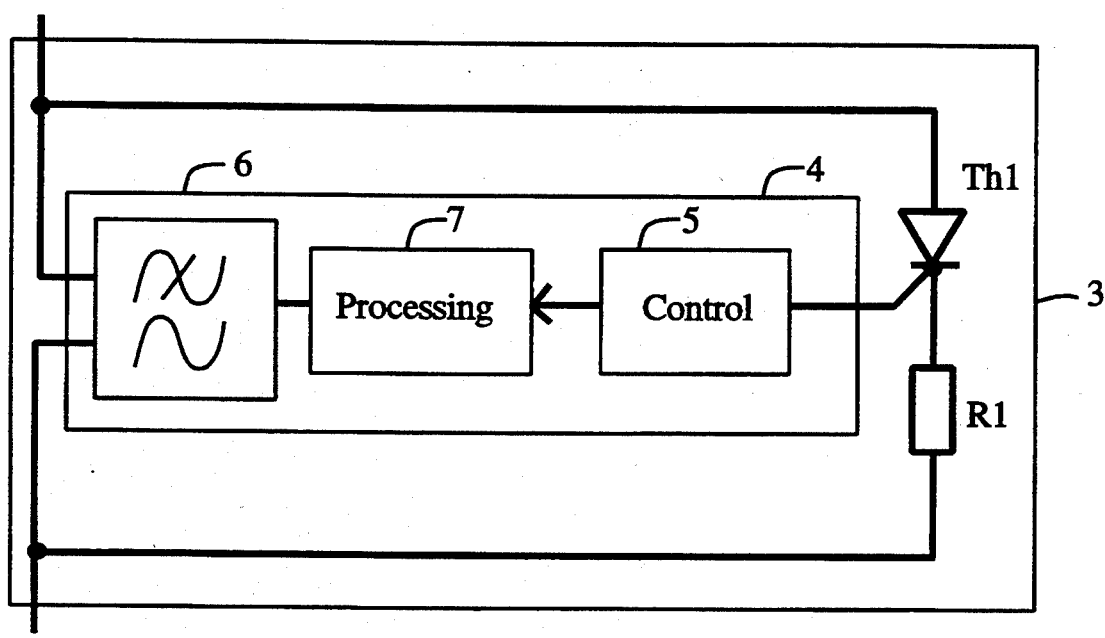
FIG. 2 represents a measuring module of a system according to a particular embodiment of the invention.

The measuring module 3 is represented in greater detail in FIG. 2. The control and measuring circuit 4 is represented in block diagram form and comprises a control circuit 5, a low-pass filter 6 and a processing circuit 7. The voltage at the terminals of the measuring module is applied to the input of the low-pass filter 6 which supplies the processing circuit 7 with a voltage representative of the DC component of its input voltage.

As illustrated in FIG. 3, a measuring cycle T, of a time greater than a period of the power system, is divided into two periods T1 and T2. During the first period T1, the control circuit 5 turns-off the thyristor Th1. No DC current component is then produced by the measuring module 3. During the second period T2, the control circuit 5 controls input to the power system of a DC current component Ic. Synchronization signals S, represented in FIG. 3 versus time, are applied to the processing circuit 7 by the control circuit 5, so as to supply the processing circuit with information representative of the periods T1 and T2.

FIG. 4 represents sampling signals E by the processing circuit 7 of the DC voltage component supplied by the filter 6. The processing circuit 7 performs a first sampling during a first measurement window Tm1, within the period T1. A second sampling is performed during a second measurement window Tm2, within the period T2. The window Tm1 is of a duration less than or equal to T1 and the window Tm2 of a duration less than or equal to T2. In the preferred embodiment represented in FIG. 4, a stabilization period (T1−Tm1 ;

T2−Tm2) is provided at the beginning of each period before the beginning of the corresponding measurement window.

Figure 5:
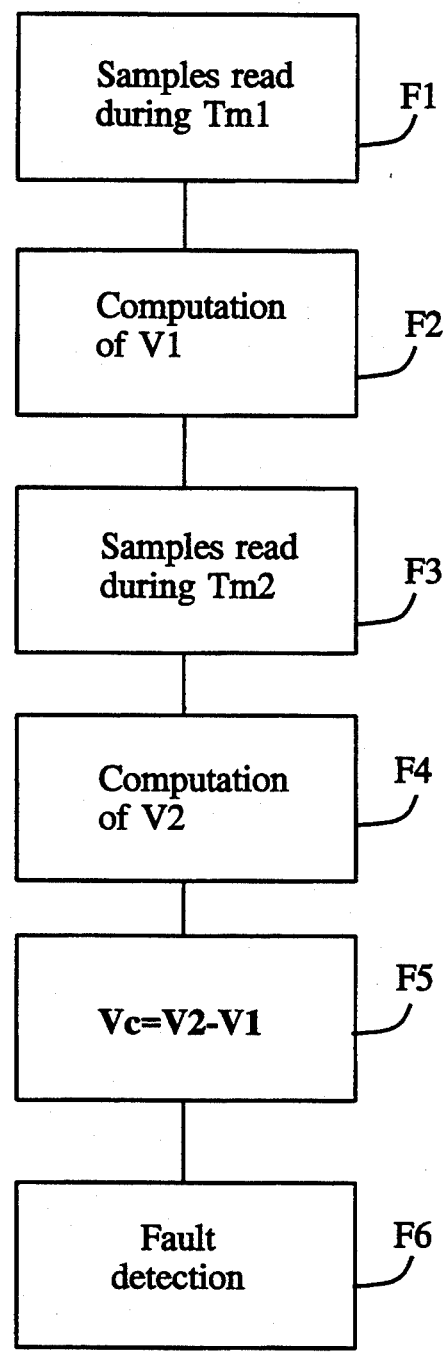
FIG. 5 represents an operational flow chart of a module of the system according to the invention.

FIG. 5 illustrates an operational flow chart of the processing circuit 7. During a first stage F1, the circuit 7 reads the samples representative of the output voltage of the filter 6 during the first window Tm1. Then, during a second stage F2, it computes, from these samples, a first value V1, representative of the value of the DC component of the input voltage of the measuring module 3 during the window Tm1. The processing circuit 7 then reads, during a third stage F3, the samples representative of the output voltage of the filter 6 during the second window Tm2. Then, during a fourth stage F4, it computes a second value V2, representative of the value of the DC component of the input voltage of the measuring module 3 during the window Tm2.

During the period T1, there being no DC current component input by the measuring module, the DC voltage applied to the terminals of the module is representative of the stray DC components, or offset voltages, of the power system. During the period T2, a DC current component being input to the power system by the measuring module, the DC voltage applied to the terminals of the module is representative of the sum of the stray DC components and of the DC voltage component to be measured Vc to determine the line resistance. The difference V2−V1, computed by the processing circuit 7 during a stage F5, is therefore representative of the DC component to be measured Vc. During a stage F6, the processing circuit detects the possible presence of a conduction fault by monitoring the variations of a quantity representative of the line resistance, derived from the difference Vc=V2−V1, to which it is proportional.

The periods T1 and T2 are preferably equal, as represented in FIG. 3. As a non-restrictive example, the period T may be a few seconds, for example 10 s, the periods T1 and T2 being equal to T/2 and the windows Tm1 and Tm2 having an identical duration, for example about 3 s.

According to a preferred embodiment, the values V1 and V2 are obtained by computing the mean of the corresponding samples, respectively obtained during the measurement windows Tm1 and Tm2. By using the mean values, the processing circuit performs an additional filtering function which enables the main part of the low frequency components of the power system to be eliminated.

To achieve a better rejection of the low frequency strays of the power system, it may be preferable to compute the values V1 and V2 from the corresponding samples taking a weighted mean. To this end, the rectangular windows of FIG. 4 can be replaced by windows which are sinusoidal or of any other suitable shape. The same type of weighting being used for computing V1 and V2, their difference remains representative of the DC voltage component Vc to be measured.

Fault detection can be performed directly by comparing the variation of Vc with a preset threshold. It is naturally possible to compute the value of the line resistance RL, proportional to Vc, and to compare its variations with a corresponding preset threshold to detect a fault. If, as in certain embodiments described in the document EP-A-430,823, the line resistance is obtained by relating the DC component Vc and the DC component of the voltage at the terminals of the resistor R1 or of a measurement shunt, the measuring principle described above also applies to measurement of the latter voltage, which is filtered, sampled respectively during the windows Tm1 and Tm2, its DC component being equal to the difference between the mean values, possibly weighted, of the samples obtained respectively during the windows Tm2 and Tm1.

In the above-mentioned document, the use of loop modules enables a portion of the power system comprised between the measuring and loop modules to be monitored. In this document, the loop module may be of the same type as the measuring module according to FIG. 1, the control and measuring circuit comprising servo means for regulating the DC component of the voltage applied to its input terminals to zero.

If the measuring module uses the measuring principle described above with reference to FIGS. 3 to 5, the operation of the loop module which may be associated must be adapted in consequence. FIG. 6 illustrates a system according to the invention enabling monitoring of the conduction of a portion of the power system comprised between the points A and B to which the measuring module 3 is connected and points C and D, located up-line from the points A and B, respectively on the conductors 1 and 2, and to which a loop module 8 is connected.

The loop module 8 comprises means for looping the DC current component produced by the measuring module 3. In FIG. 6, a thyristor Th2, connected in series with a resistor R2, is connected between the points C and D so as to enable the current to flow from conductor 2 to conductor 1, i.e. in the reverse direction from the thyristor Th1. It comprises a control and measuring circuit 9 synchronized with the control and measuring circuit of the measuring module 3, for example by a synchronization link 10. Synchronization enables the thyristors Th1 and Th2 to be turned-off simultaneously during the period T1, and to be turned-on simultaneously during the period T2. The DC voltage component Vc (CD) at the terminals of the loop module 8 is measured in the same way as the DC voltage component Vc (AB) at the terminals of the measuring module 3 and their difference Vc (AB)−Vc (CD) is representative of the DC voltage component at the terminals of the line resistance RL of the portion of the power system involved.

Simultaneous sampling of the DC voltages present at the terminals of the measuring and loop modules enables residual low frequency strays to be eliminated. The DC components measured respectively during the measurement windows Tm1 and Tm2 between the points A and B and, respectively, C and D, can in fact be broken down in the following form:

$$V1 (AB) = Vof1 + Vlf1$$

$$V1 (CD) = Vof2 + Vlf1$$

$$V2 (AB) = V (AB) + Vof1 + Vlf2$$

$$V2 (CD) = V (CD) + Vof2 + Vlf2$$

where V1 (AB) and V1 (CD) are the DC components measured during the window Tm1, between A and B and, respectively, between C and D.

V2 (AB) and V2 (CD) are the corresponding components measured during the window Tm2.

Vof1 is the offset voltage between A and B, considered to be constant over a period T.

Vof 2 is the offset voltage between C and D, considered to be constant over a period T.

Vlf 1 is the residual low frequency noise during the period T1 and the window Tm1.

Vlf 2 is the residual low frequency noise during the period T2 and the window Tm2.

V (AB) and V (CD) are the DC components, with the stray components removed, to be measured at the terminals of the measuring and loop modules.

It can be verified that the offset voltages are eliminated when the respective computation of the differences Vc (AB) =V2 (AB)−V1 (AB) and Vc (CD)=V2 (CD)−V1 (CD) is performed, and that the residual noise is eliminated by computation of the difference Vc (AB)−Vc (CD) which acts as the basis for conduction monitoring.

The invention is not limited to the embodiments particularly described above. In particular, the thyristors can be replaced by any other type of controlled rectifier, and the resistor R1 can be replaced by a non-dissipating circuit tuned to the power system. The low-pass filters can be analog or digital. The control and measuring circuits can comprise microprocessors, some components being able to be common to several circuits.

The control and measuring circuits 4 and 9 of the system according to FIG. 6 can be connected to a centralized processing circuit which computes the difference Vc (AB)−Vc (CD) or this difference can be computed in one of the modules, which indicates a conduction fault should one arise.

When the system comprises a loop module, this loop module must be synchronized with the measuring module to block any current flow during the period T1. The thyristors Th1 and Th2 are preferably also synchronized during the period T2. However it is envisageable to regulate the DC voltage component at the terminals of the loop module to zero during the period T2, the DC voltage component at the terminals of the measuring module then being directly representative of the line resistance.

The same measuring principles are applicable to a three-phase power system, the modules then being connected between two phases.

We claim:

1. A system for continuous monitoring of the electrical conduction of at least a portion of an AC power system, said system comprising:

at least one module comprising means for producing a DC current component between first and second points located respectively on first and second conductors of the power system, processing means for measuring a DC voltage component applied between the first and second points and for detecting a conduction fault based on said DC voltage component;

wherein the means for producing a DC current component comprises a controlled rectifier having a control input and control means, connected to said control input, for controlling the controlled rectifier, wherein said control means generates a turn-off signal for the controlled rectifier during a first period, of preset duration, of a measuring cycle and control signals designed to produce said DC current component during a second period, of preset duration, of the measuring cycle; and wherein the processing means measures first and second values respectively representative of said DC voltage component during said first and second periods, and computes the difference between the first and second values, said difference being representative of the DC voltage component to be measured.

2. The system according to claim 1, wherein the measuring cycle has a duration greater than a period of the power system.

3. The system according to claim 2, wherein the measuring cycle has a duration of about 10 s.

4. The system according to claim 1, wherein the processing means measures the first value by sampling during a first measurement window having a duration less than or equal to the first period.

5. The system according to claim 1, wherein the processing means measures the second value by sampling during a second measurement window having a duration less than or equal to the second period.

6. The system according to claim 5, wherein the processing means computes a mean value of the samples measured during the first and second measurement windows.

7. The system according to claim 5, wherein the processing means computes a weighted mean value of the samples measured during the first and second measurement windows.

8. The system according to claim 1, comprising at least one first module constituting a measuring module and one second module constituting a loop module, a controlled rectifier of the loop module being reverse-mounted with respect to a controlled rectifier of the measuring module, wherein control means of the measuring and loop modules are synchronized so as to turn-off the controlled rectifiers of said modules during the first period.

9. The system according to claim 8, comprising means for computing the difference between the DC voltage components at terminals of the measuring and loop modules, wherein processing means of the measuring and loop modules simultaneously sample respective voltages to be measured by the measuring and loop modules.

10. The system according to claim 1, wherein the controlled rectifier is a thyristor.

* * * * *